US 6,538,942 B2

(12) United States Patent
Ferrant

(10) Patent No.: US 6,538,942 B2
(45) Date of Patent: Mar. 25, 2003

(54) PROCESS FOR CONTROLLING A READ ACCESS FOR A DYNAMIC RANDOM ACCESS MEMORY AND CORRESPONDING MEMORY

(75) Inventor: Richard Ferrant, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/883,697

(22) Filed: Jun. 18, 2001

(65) Prior Publication Data

US 2002/0009008 A1 Jan. 24, 2002

(30) Foreign Application Priority Data

Jun. 26, 2000 (FR) .......................................... 00 08131

(51) Int. Cl.[7] ................................................. G11C 7/00
(52) U.S. Cl. .................. 365/203; 365/210; 365/189.09
(58) Field of Search ............................ 365/203, 189.01, 365/196, 204, 210, 189.09

(56) References Cited

U.S. PATENT DOCUMENTS 5,699,294 A * 12/1997 Yamada et al. ............. 257/906
5,701,268 A    12/1997 Lee et al. ................... 365/205
5,859,794 A *  1/1999 Chan .......................... 365/149
6,034,885 A *  3/2000 Chan .......................... 365/149
6,337,824 B1 * 1/2002 Kono et al. ................. 365/205

* cited by examiner

Primary Examiner—David Nelms
Assistant Examiner—Thong Le
(74) Attorney, Agent, or Firm—Allen, Dyer, Doppelt Milbrath & Gilchrist, P.A.; Lisa K. Jorgenson

(57) ABSTRACT

Each memory cell of a memory device is connected to a bit line of a memory array and is associated with a read/rewrite amplifier connected between the bit line and a reference bit line. The bit line and the reference bit line are precharged to a predetermined precharge voltage. The content of a selected memory cell is read and refreshed based upon an associated read/rewrite amplifier. Between the precharging and the reading and refreshing, two capacitors previously charged to a charging voltage greater than the precharge voltage are respectively connected to the bit line and to the reference bit line.

30 Claims, 3 Drawing Sheets

PROCESS FOR CONTROLLING A READ ACCESS FOR A DYNAMIC RANDOM ACCESS MEMORY AND CORRESPONDING MEMORY

FIELD OF THE INVENTION

The invention relates to dynamic random access memories (DRAMs), and in particular, to the control of a read access and to the supervision of the operation of the read/rewrite amplifiers. The invention applies advantageously but not limitingly to embedded dynamic memories (embedded DPAMs), that is, memories which are made jointly with other components by the same process, for example, and are intended to be integrated together within an application specific integrated circuit (ASIC).

BACKGROUND OF THE INVENTION

The information stored in a static random access memory (SRAM) remains so indefinitely, at least for as long as the memory remains energized. In contrast, a dynamic memory requires a periodic refreshing of the information stored on account of the stray leakage currents. In particular, the stray leakage currents discharge the storage capacitance of each memory slot.

Among the mentioned dynamic random access memory cells, they may be made, in particular, to comprise one, two or three transistors. Conventionally, dynamic random access memories are organized as rows and columns of memory cells. Each column comprises a metallization path commonly referred to as a bit line and an immediately adjacent bit line referred to as a reference or inverse bit line.

Precharging means are provided for each column for precharging the bit line and the reference bit line associated with a column before a read access of the memory is performed. Precharging the bit lines and the reference bit lines is generally performed at a voltage equal to Vdd/2 in the case where the supply voltage Vdd represents the storage voltage for a high state (typically a logic 1), and 0 volts (ground) represents the storage voltage for a low state (typically a logic 0).

Most DRAM devices use a row of reference cells, also connected to the bit lines and the reference bit lines, to equalize the charges applied thereto and to maximize the mean amplitude of the signal between the 0's and the 1's. Other precharging means are also provided for precharging a row of reference cells. The precharging of the reference cells is generally also performed at Vdd/2.

During a read access of a memory cell connected to a bit line, this cell and a reference cell connected to the reference bit line are selected (activated), then the sign of the difference in voltage between the bit line and the reference bit line is detected to determine the logic content of the memory cell, i.e., a logic 0 or 1.

These detections are conventionally performed with the aid of a read/rewrite amplifier connected between the bit line and the reference bit line. This amplifier generally comprises two looped-back inverters forming a bistable flip-flop. Each is formed of two complementary transistors and controlled by two successive signals. These two signals are read and rewrite, which are commonly known as sense and restore signals. Upon the activation of the restore signal, the data item read from the memory cell is rewritten, thus refreshing the content of this memory cell. However, a conventional memory structure of this kind has certain drawbacks.

Specifically, after precharging the bit line and the reference bit line of a column, and during the selection of the memory cell, the voltage at the gates of the two NMOS transistors of the read/rewrite amplifier is substantially on the order of Vdd/2. Upon activation of the sense signal, the source of these two NMOS transistors is then grounded. It follows from this that the gate-source voltage of these NMOS transistors is then substantially equal to Vdd/2. These transistors are on if the gate-source voltage is greater than the threshold voltage of these transistors.

Also, as the technology evolves, the level of the supply voltage is dropping, while the threshold voltage of an NMOS transistor remains substantially constant. Thus, for 0.18 micron technology, the supply voltage is on the order of 1.8 volts, while for 0.12 micron technology it is on the order of 1.2 volts.

Consequently, with advanced technologies and in particular the 0.15 micron and less technologies, the difference between the gate-source voltage of the NMOS transistor and its threshold voltage may become very small, even less than the threshold voltage or offset of the amplifier. This leads to erroneous rewriting and erroneous refreshing of the data item read. In the worst case, this voltage difference may be negative, thereby preventing the NMOS transistors of the amplifier from being turned on, and consequently, stopping it from operating.

SUMMARY OF THE INVENTION

In view of the foregoing background, an object of the present invention is to provide for the proper operation of the read/rewrite amplifier, and in particular for advanced technologies, such as 0.15 or 0.12 micron or less technologies.

The invention therefore provides a process for controlling a read access for a memory cell of a memory plane or memory array of a dynamic random access memory device. The memory cell is connected to a bit line of the memory plane and is associated with a read/rewrite amplifier connected between the bit line and a reference bit line. The control process comprises a phase of precharging the bit line and the reference bit line to a predetermined precharge voltage (e.g., Vdd/2), and a phase of reading and refreshing the content of the selected memory cell based upon an activated read/rewrite amplifier.

According to a general characteristic of the invention, between the precharging phase and the reading and refreshing phase, two capacitors previously charged to a charging voltage greater than the precharge voltage (for example, to a charging voltage equal to Vdd) are respectively connected to the bit line and to the reference bit line.

Stated otherwise, according to the invention, the common-mode voltage of the read/rewrite amplifier is thus increased before the reading and refreshing phase so as to increase the voltage on the gate of the NMOS transistors and consequently obtain a bigger gate-source voltage difference across the terminals of the NMOS transistors, even with a smaller supply voltage.

According to one mode of implementation of the invention, each capacitor is charged for a predetermined duration. For example, the duration is equal to the duration of precharging the bit lines and the reference bit lines. The charging is stopped just before connecting the capacitor thus charged to the corresponding bit line. By stopping the charging just before connecting the capacitor to the corresponding bit line, it is thus possible to minimize the stray leakages.

The invention also provides a dynamic random access memory device comprising a memory plane that includes columns each formed of a bit line and a reference bit line, to which are connected rows of memory cells. A read/rewrite controllable amplifier is preferably connected to each column of the memory plane, and controllable means select a row of memory cells. Controllable means of column precharging, connected to each column, precharge the bit line and the reference bit line of a column connected to a selected memory cell to a predetermined precharge voltage.

The dynamic random access memory device preferably further includes two capacitors respectively connected to the bit line and to the reference bit line of a column by two controllable connection interrupters. Controllable means of charging charges each capacitor to a charging voltage greater than the precharge voltage, and control means for activating the means of charging the capacitors and to activate in succession the precharging means, the two connection interrupters, the selection means and the read/rewrite amplifier is also provided for controlling the read access of the selected memory cell.

According to one embodiment of the invention, the control means are able to activate the charging means for a predetermined duration, then to deactivate the charging means just before closing the two connection interrupters. The charging means advantageously comprises, for each capacitor, a controllable charging interrupter connected between a voltage source delivering the charging voltage, e.g., the supply voltage, and a terminal of the capacitor.

BRIEF DESCRIPTION OF THE DRAWINGS

Other advantages and characteristics of the invention will become apparent on examining the detailed description of modes of implementation and embodiments, which are in no way limiting, and the appended drawings, in which.

DETAILED DESCRIPTION OF THE PREFERRED EMBODIMENTS

Figure 1:
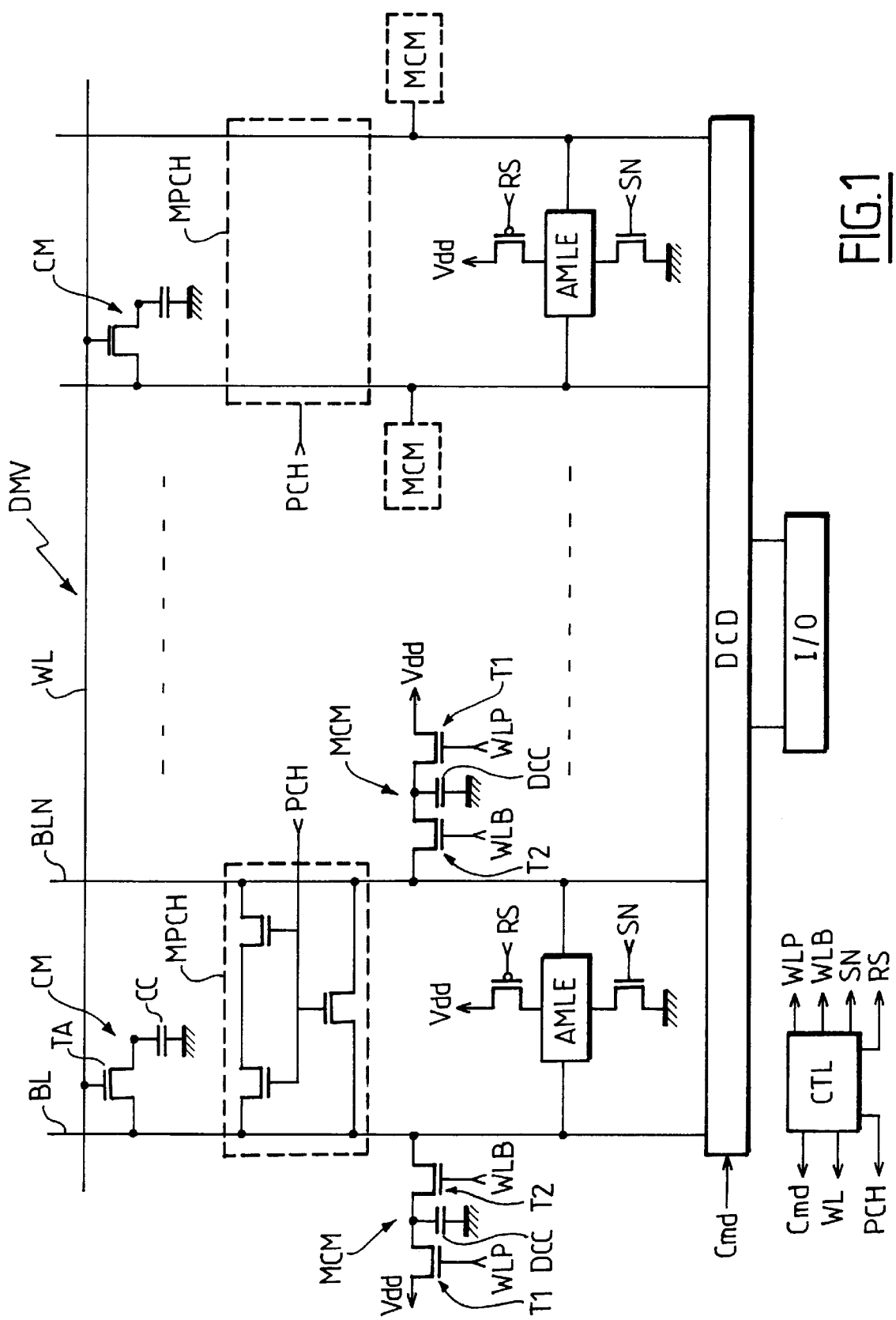
FIG. 1 illustrates the architecture of a dynamic random access memory according to the present invention.

In FIG. 1, the reference DMV designates in a general manner a random access memory device according to the invention. This random access memory device comprises a memory plane or memory array comprising a plurality of memory cells CM organized in rows and columns. Each memory cell CM comprises an access transistor TA and a storage capacitor CC. Of course, the invention is not limited to this type of dynamic random access memory cell.

All the cells CM of the same row can be simultaneously activated by an activation signal WL propagating on a word line. Specifically, the gates of the transistor TA of these memory cells CM are connected to this word line WL. Moreover, all the cells of the row are respectively linked to a column or bit line BL.

With each bit line BL there is also associated an immediately adjacent bit line BLN, commonly referred to by the person skilled in the art as a reference or inverse bit line. The reference bit lines BLN make it possible to connect other rows of memory cells in a quincunx fashion. Of course, for a memory cell connected to a reference bit line BLN, the bit line BL then acts as a reference bit line.

At the foot of each column is a column decoder DCD of conventional structure, controlled by a column decoding signal Cmd. This column decoder DCD makes it possible to select one of the columns of the memory plane to allow the delivery to the output interface I/O of the random access memory device of the content of the memory cell placed at the intersection of the selected column and the selected row.

The random access memory device DMV moreover comprises controllable means for column precharging MPCH, which is of conventional structure. The precharging means MPCH, for example, may be formed by three transistors controlled by the signal PCH. The precharging means clamp the bit line BL and the reference bit line BLN of a column, and make it possible during clamping, that is to say when the three transistors are on, to equalize the potential of the bit line and the reference bit line.

All the precharging means MPCH of the random access memory device can be connected to a generator (not represented here for the sake of simplification) which makes it possible to maintain the precharging voltages of the bit lines and of the reference bit lines in the case, for example, of prolonged non-use of the memory, doing so to limit the current leakage effects.

Figure 2:
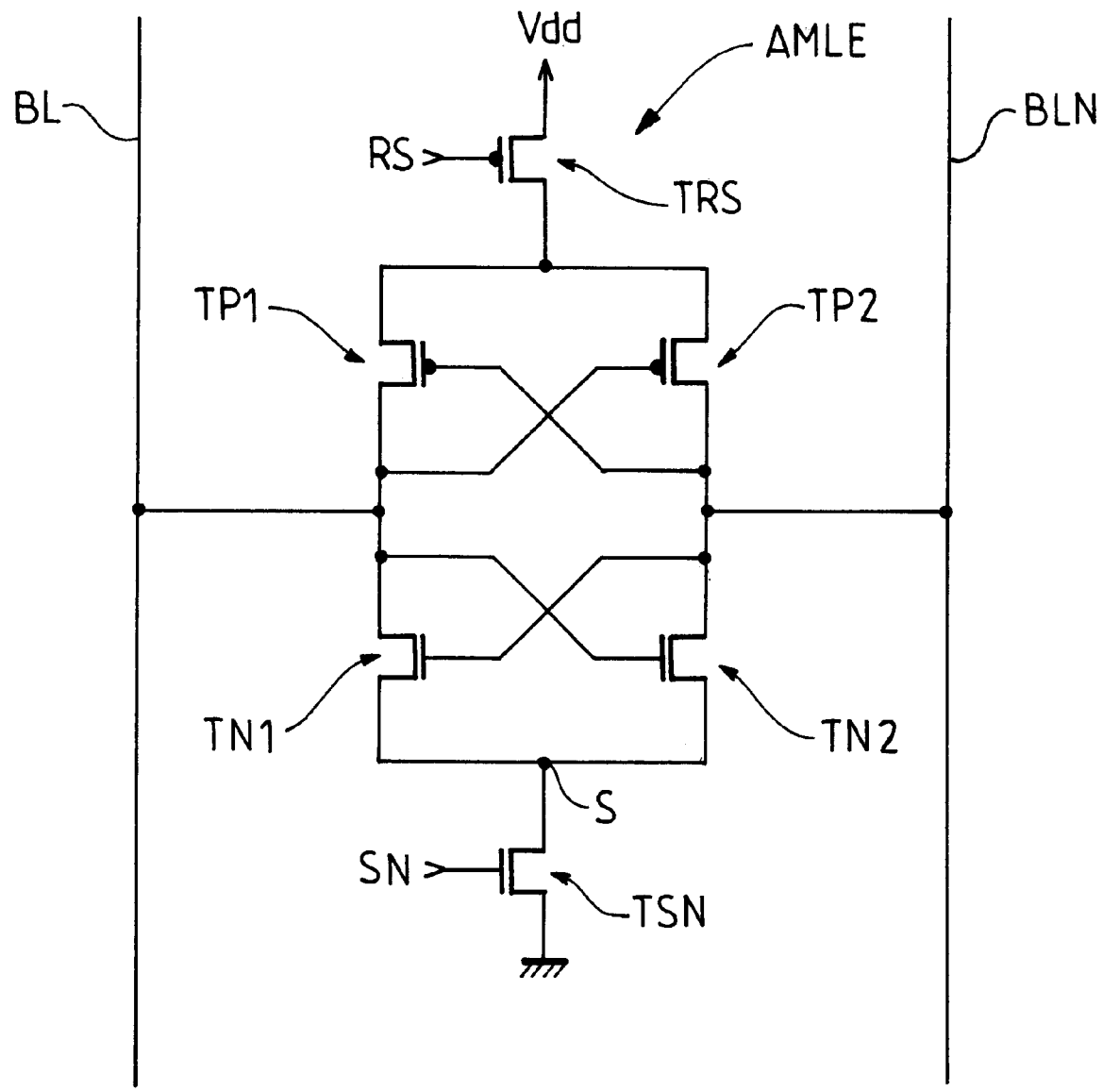
FIG. 2 illustrates the internal architecture of the read/rewrite amplifier illustrated in FIG. 1.

The random access memory device DMV moreover comprises, in a conventional manner, a controllable read/rewrite amplifier AMLE connected to each column of the memory plane. More precisely, this read/rewrite amplifier is connected between the bit line BL and the reference bit line BLN of the column. The structure of such a read/rewrite amplifier is known to the person skilled in the art, and in particular through French patent application No. 2,768,847, wherein FIG. 2 therein illustrates the essential aspects thereof.

Thus, the amplifier AMLE comprises two looped-back amplifiers, formed by two PMOS transistors referenced TP1 and TP2, and by two NMOS transistors referenced TN1 and TN2. The sources S of these two NMOS transistors are linked to ground by way of a control transistor TSN controlled on its gate by a read signal SN (sense signal). Likewise, the sources of the two PMOS transistors TP1 and TP2 are linked to the supply voltage Vdd by way of another control transistor TRS controlled on its gate by a rewrite signal RS (restore). The gates of the transistors TN1 and TN2 in particular are linked in cross fashion to the bit line BL and to the reference bit line BLN.

Apart from the means just described, the random access memory device DMV according to the invention comprises means MCM connected to the bit line BL and to the reference bit line BLN of each column, which is intended, as will be seen in greater detail below, to boost the common-mode voltage of the amplifier AMLE.

Each means MCM comprises a capacitor DCC, one terminal of which is grounded and the other terminal of which is linked to the corresponding bit line (bit line BL or bit line BLN) by a transistor T2, and to the supply voltage Vdd by another transistor T1. Transistor T2 is controlled on its gate by a control signal WLB and operates as a controllable connection interrupter. Transistor T1 is controlled on its gate by another control signal WLP and operates as a controllable charging interrupter.

The reference cells connected to the bit lines and the reference bit lines have not been represented in FIG. 1 for the sake of simplification. The activation signal WL, conveyed by the metallization path bearing the same reference, as well as the control signals SN, RS, Cmd, PCH, WLB, and WLP are delivered by control means CTL which may be conventionally logic gate based.

Figure 3:
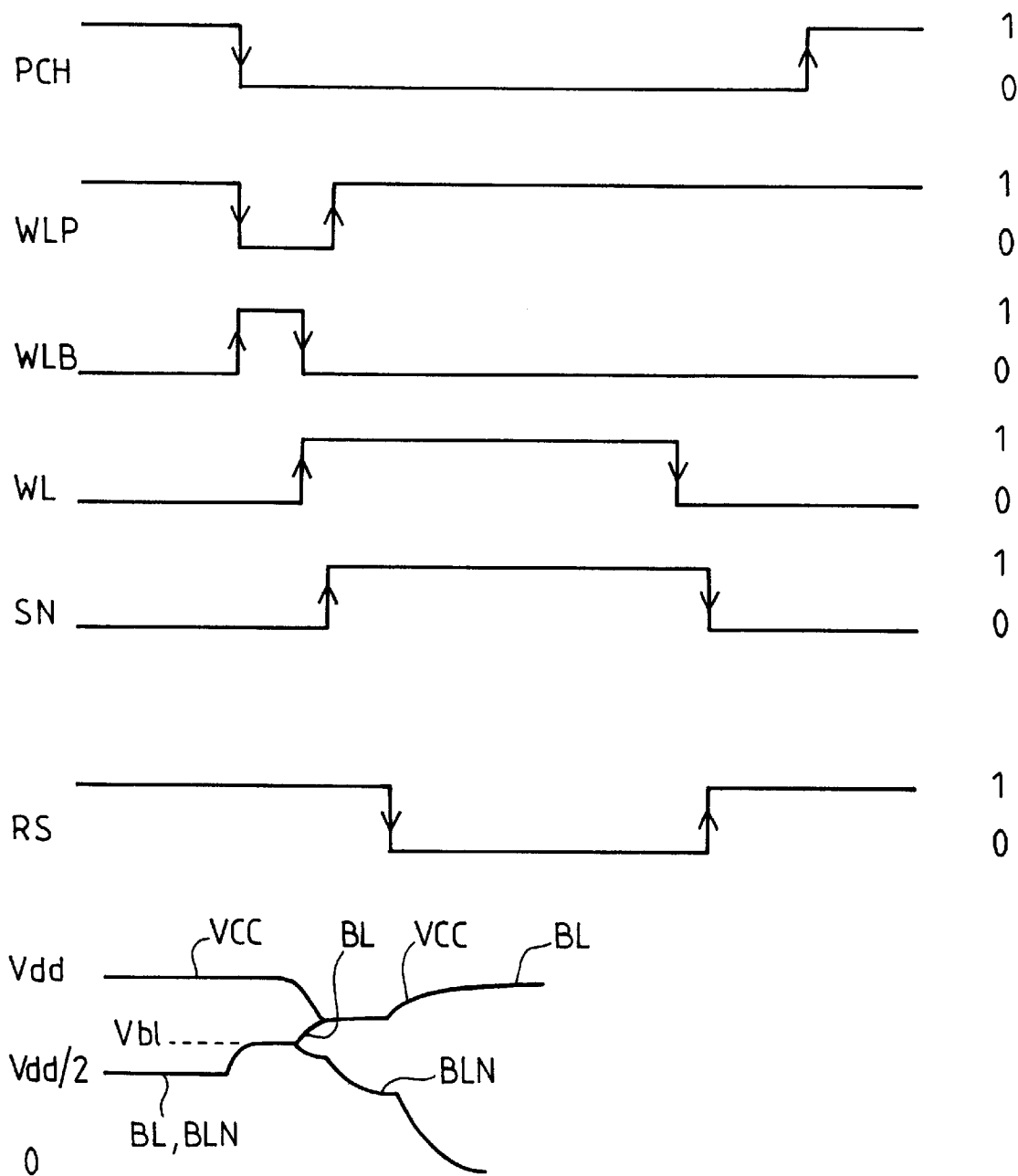
FIG. 3 is a timing chart illustrating an implementation of the process according to the present invention.

Reference is now made to FIG. 3 to describe a mode of implementing the process according to the invention. In FIG. 3, it is assumed that the supply voltage is equal to Vdd and that the memory cell CM stores a logic 1. It is assumed, moreover, that after the previous read access, the bit line and the bit line BLN have been previously precharged to the precharge voltage equal to Vdd/2, obtained by clamping the bit line BL and the reference line BLN (signal PCH in the 1 state).

It is also assumed that, during this phase of precharging the bit line and the reference bit line of each column, the capacitor DCC of each means MCM has been charged to the supply voltage Vdd (transistor T1 on, signal WLP in the 1 state). Since the memory cell stores a logic 1, the voltage VCC across the terminals of the storage capacitance CC of the memory cell is equal to Vdd (neglecting the leakage currents).

When precharging the bit lines is interrupted and when the capacitor DCC is disconnected from the supply voltage (signal WLP at 0), the capacitor DCC is connected to the corresponding bit line by closing the connection interrupter T2 (signal WLB at 1). At that moment, the charge contained in the capacitor DCC is transferred to the bit line and the reference bit line according to equation (I) below:

$$(Cbl + Ccell) * Vbl = Cbl * \frac{Vdd}{2} + Ccell * Vdd \quad (I)$$

in which Cbl represents the capacitive value of a bit line or of a reference bit line, Ccell represents the capacitive value of the capacitor DCC, Vbl represents the voltage on the bit line or the reference bit line and Vdd represents the supply voltage.

Hence, it follows from this that the voltage Vbl on each of the bit lines is defined by equation (II) below:

$$Vbl + \left[ \frac{Cbl}{2*(Cbl+Ccell)} + \frac{Ccell}{(Cbl+Ccell)} \right] * Vdd \quad (II)$$

This results in a big increase in the voltage on the bit line, as illustrated at the bottom of FIG. 3. By way of indication, for a capacitive value Cbl equal to 100 fF and a value Ccell equal to 30 fF, the voltage Vbl is equal to 0.615 Vdd.

Before activating the signal WL, and preferably just before activating this signal WL, the signal WLB is deactivated. That is, the transistor T2 of each means MCM is turned off to electrically isolate the capacitor DCC from the corresponding bit line.

At this moment, the voltage VCC is balanced with the voltage of the bit line BL at an intermediate value lying between Vbl and Vdd, while the voltage of the reference bit line BLN decreases slightly. The signal SN is then activated. This makes it possible to read the data item contained in the memory cell, then the signal RS is activated. This makes it possible to rewrite this data item to the memory cell, and consequently to refresh the latter. The activation of the signal RS thus has the conventional consequence of raising the voltage of the bit line BL and the voltage VCC to the supply voltage and of making the voltage of the bit line BLN drop back to 0.

The action of having increased the voltage Vbl (with respect to the voltage Vdd/2) by transferring the charge contained in the capacitors DCC has made it possible to insure a sufficient gate-source voltage to allow the transistors TN1 and TN2 of the amplifier AMLE to be turned on upon activation of the signal SN. The read and refresh cycle terminates with the deactivation of the signal WL, then with that of the signals SN and RS.

In order to prepare the memory for a new read access, the bit lines and the reference bit lines are precharged again by activating the signal PCH. The signal WLP, which, in the present case, has been reactivated after deactivation of the signal WLB, can in fact be reactivated at any moment before the activation of the signal WLB, and in particular in a manner incidental with the precharging of the bit lines and of the reference bit lines.

The invention thus makes it possible in a relatively straightforward manner to increase the common mode of the read/rewrite amplifier. This modification, which includes adding capacitors and transistors, consumes no energy other than that required to charge the capacitors. Moreover, a capacitor having a same capacitive value as that of the capacitor of the memory cell can advantageously be chosen. Provisions may also be made for a capacitor having a capacitive value equal to a multiple of the capacitive value of the capacitor of the memory cell, by connecting, for example, several capacitors DCC in parallel. This makes it possible to adapt the device according to the invention to evolving technology. Specifically, as the technology evolves and the supply voltage gets lower, another capacitor DCC can be added in parallel relative to a structure which already exists for a given technology.

That which is claimed is:

1. A method for controlling a read access of a memory cell of a dynamic random access memory device, each memory cell being connected to a bit line and associated with a read/rewrite amplifier connected between the bit line and a corresponding reference bit line, the method comprising:

precharging the bit line and the corresponding reference bit line for a selected memory cell to a precharge voltage reading and refreshing contents of the selected memory cell based upon an activated read/rewrite amplifier associated therewith; and connecting at least one first capacitor previously charged to a charging voltage greater than the precharge voltage to the bit line of the selected memory cell, and connecting at least one second capacitor previously charged to a charging voltage greater than the precharge voltage to the corresponding reference bit line of the selected memory cell between the precharging and the reading and refreshing.

2. A method according to claim 1, further comprising:

charging the at least one first capacitor for a predetermined duration prior to the at least one first capacitor being connected to the bit line; and charging the at least one second capacitor for the predetermined duration prior to the at least one second capacitor being connected to the reference bit line.

3. A method according to claim 2, wherein the predetermined duration ends just before the at least one first and second capacitors are to be connected to the bit line and the reference bit line.

4. A method according to claim 1, wherein the at least one first capacitor comprises a single capacitor having a same value as a capacitance of the selected memory cell, and the at least one second capacitor comprises a single capacitor having the same value as the capacitance of the selected memory cell.

5. A method according to claim 1, wherein the at least one first capacitor comprises a plurality of capacitors each having a value that is a multiple of a capacitance of the selected memory cell, and the at least one second capacitor comprises a plurality of capacitors each having a value that is the multiple of the capacitance of the selected memory cell.

6. A method for controlling a read access of a memory cell of a memory device, each memory cell being connected to a line and associated with a read amplifier connected between the bit line and a corresponding reference bit line, the method comprising:

precharging the bit line and the corresponding reference bit line for a selected memory cell to a precharge voltage;

reading contents of the selected memory cell based upon an actived read amplifier associated therewith; and connecting at least one first capacitor previously charged to a charging voltage greater than the precharge voltage to the bit line of the selected memory cell, and connecting at least one second capacitor previously charged to a charging voltage greater than the precharge voltage to the predetermined duration prior to the at least one first capacitor being connected the bit line; and charging the at least one second capacitor for the predetermined duration prior to the at lest one second capacitor being connected to the reference bit line.

7. A method according to claim 6, further comprising:

charging the at least one first capacitor for a predetermined duration prior to the at least one first capacitor being connected the bit line; and charging the at least one second capacitor for the predetermined duration prior to the at least one second capacitor being connected to the reference bit line.

8. A method according to claim 7, wherein the predetermined duration ends just before the at least one first and second capacitors are to be connected to the bit line and the reference bit line.

9. A method according to claim 6, further comprising refreshing the contents of the selected memory cell.

10. A method according to claim 6, wherein the memory device comprises a dynamic random access memory (DRAM).

11. A method according to claim 6, wherein the at least first capacitor comprises a single capacitor having a same value as a capacitance of the selected memory cell, and the at least one second capacitor comprises a single capacitor having the same value as the capacitance of the selected memory cell.

12. A method according to claim 6, wherein the at least first capacitor comprises a plurality of capacitors each having a value that is a multiple of a capacitance of the selected memory cell, and the at least one second capacitor comprises a plurality of capacitors each having a value that is the multiple of the capacitance of the selected memory cell.

13. A dynamic random access memory device comprising:

a memory array comprising a plurality of memory cells arranged in rows and columns, each memory cell being connected to a column having a bit line and a corresponding reference bit line, and each column having associated therewith rows of memory cells;

a read/rewrite amplifier connected to each column;

selecting means for selecting a memory cell;

precharging means connected to each column for precharging the bit line and the corresponding reference bit line to a precharge voltage;

a first controllable connection interrupter connected to each bit line, and a second controllable connection interrupter connected to each reference bit line;

at least one first capacitor connected to each first controllable connection interrupter, and at least one second capacitor connected to each second controllable connection interrupter;

charging means for charging said at least one first capacitor and said at least one second capacitor to a charging voltage greater than the precharge voltage associated with a selected memory cell between the precharging and a read access being performed for the selected memory cell; and control means for activating said charging means and for activating in succession said precharging means, said first and second controllable connection interrupters, said selecting means and said read/rewrite amplifier associated with the selected memory cell for controlling the read access thereof.

14. A dynamic random access memory device according to claim 13, wherein said control means activates said charging means for a predetermined duration, then deactivates said charging means prior to closing said first and second controllable connection interrupters.

15. A dynamic random access memory device according to claim 13, wherein said charging means comprises:

a first controllable charging interrupter connected between a voltage source providing a charging voltage and a terminal of said at least one first capacitor; and a second controllable charging interrupter connected between the voltage source providing the charging voltage and a terminal of said at least one second capacitor.

16. A dynamic random access memory device according to claim 15, wherein said first controllable charging interrupter comprises a transistor, and said second controllable charging interrupter comprises a transistor.

17. A dynamic random access memory device according to claim 13, wherein said at least first capacitor comprises a single capacitor having a same value as a capacitance of said selected memory cell, and said at least one second capacitor comprises a single capacitor having the same value as the capacitance of said selected memory cell.

18. A dynamic random access memory device according to claim 13, wherein said at least first capacitor comprises a plurality of capacitors each having a value that is a multiple of a capacitance of said selected memory cell, and said at least one second capacitor comprises a plurality of capacitors each having a value that is the multiple of the capacitance of said selected memory cell.

19. A dynamic random access memory device according to claim 13, wherein said first controllable connection interrupter comprises a transistor, and said second controllable connection interrupter comprises a transistor.

20. A memory device comprising:

a memory array comprising a plurality of memory cells arranged in rows and columns, each memory cell being connected to a column having a bit line and a corresponding reference bit line, and each column having associated therewith rows of memory cells;

a read/rewrite amplifier connected to each column;

a precharging circuit connected to each column for precharging the bit line and the corresponding reference bit line to a precharge voltage;

a first controllable connection interrupter connected to each bit line, and a second controllable connection interrupter connected to each reference bit line;

at least one first capacitor connected to each first controllable connection interrupter, and at least one second capacitor connected to each second controllable connection interrupter; and a charging circuit for charging each of said at least one first capacitor and said at least one second capacitor to a charging voltage greater than the precharge voltage associated with a selected memory cell prior to a read access being performed for the selected memory cell.

21. A memory device according to claim 20, further comprising a selection circuit for selecting a memory cell.

22. A memory device according to claim 21, further comprising a control circuit for activating said charging circuit and for activating in succession said precharging circuit, said first and second controllable connection interrupters, said selection circuit and said read/rewrite amplifier for controlling the read access.

23. A memory device according to claim 20, wherein said charging circuit charges said at least one first capacitor for a predetermined duration prior to said at least one first capacitor being connected the bit line, and charges said at least one second capacitor for the predetermined duration prior to said at least one second capacitor being connected to the reference bit line.

24. A memory device according to claim 23, wherein the predetermined duration ends when said at least one first and second capacitors are to be connected to the bit line and the reference bit line of said selected memory cell.

25. A memory device according to claim 20, wherein said plurality of memory cells are configured so that the memory device comprises a dynamic random access memory (DRAM).

26. A memory device according to claim 20, wherein said at least first capacitor comprises a single capacitor having a same value as a capacitance of the selected memory cell, and said at least second capacitor comprises a single capacitor having the same value as the capacitance of the selected memory cell.

27. A memory device according to claim 20, wherein the at least first capacitor comprises a plurality of capacitors each having a value that is a multiple of a capacitance of the selected memory cell, and the at least second capacitor comprises a plurality of capacitors each having a value that is the multiple of the capacitance of the selected memory cell.

28. A memory device according to claim 20, wherein said first controllable charging interrupter comprises a transistor, and said second controllable charging interrupter comprises a transistor.

29. A memory device according to claim 20, wherein said charging means comprises:

a first controllable charging interrupter connected between a voltage source providing a charging voltage and a terminal of said at least one first capacitor; and a second controllable charging interrupter connected between the voltage source providing the charging voltage and a terminal of said at least one second capacitor.

30. A memory device according to claim 29, wherein said first controllable connection interrupter comprises a transistor, and said second controllable connection interrupter comprises a transistor.

* * * * *

UNITED STATES PATENT AND TRADEMARK OFFICE
CERTIFICATE OF CORRECTION

PATENT NO. : 6,538,942 B2
DATED : March 25, 2003
INVENTOR(S) : Richard Ferrant

It is certified that error appears in the above-identified patent and that said Letters Patent is hereby corrected as shown below:

Column 1,
Line 14, delete "DPAMs" insert - DRAMs --

Column 7,
Lines 20-25, delete "predetermined duration prior to the at least one first capacitor being connected to the bit line; and charging the at least one second capacitor for the predetermined duration prior to the at lest one second capacitor being connected to the reference bit line" insert:
-- corresponding reference bit line of the selected memory cell between the precharging and the reading --

Signed and Sealed this

Ninth Day of September, 2003

JAMES E. ROGAN
*Director of the United States Patent and Trademark Office*